(12) United States Patent
Pizzato

(10) Patent No.: US 10,049,843 B2
(45) Date of Patent: Aug. 14, 2018

(54) ELECTRONIC-OPERATED SAFETY SWITCH

(71) Applicant: PIZZATO ELETTRICA S.R.L., Marostica (IT)

(72) Inventor: Marco Pizzato, Marostica (IT)

(73) Assignee: PIZZATO ELETTRICA S.R.L., Marostica (VI) (IT)

( * ) Notice: Subject to any disclaimer, the term of this patent is extended or adjusted under 35 U.S.C. 154(b) by 462 days.

(21) Appl. No.: 14/895,727

(22) PCT Filed: Dec. 8, 2014

(86) PCT No.: PCT/IB2014/066708
§ 371 (c)(1),
(2) Date: Dec. 3, 2015

(87) PCT Pub. No.: WO2015/083143
PCT Pub. Date: Jun. 11, 2015

(65) Prior Publication Data
US 2016/0133416 A1    May 12, 2016

(30) Foreign Application Priority Data
Dec. 6, 2013   (IT) ................ VI2013A0290

(51) Int. Cl.
| | |
|---|---|
| *H01H 50/16* | (2006.01) |
| *H01H 50/02* | (2006.01) |
| *H03K 17/945* | (2006.01) |
| *H03K 17/94* | (2006.01) |
| *H01H 50/32* | (2006.01) |
| *H01H 27/00* | (2006.01) |
| *H03K 17/95* | (2006.01) |

(52) U.S. Cl.
CPC .......... *H01H 50/16* (2013.01); *H01H 27/002* (2013.01); *H01H 50/02* (2013.01); *H01H 50/32* (2013.01); *H03K 17/941* (2013.01); *H03K 17/945* (2013.01); *H03K 17/9502* (2013.01); *H03K 2217/958* (2013.01)

(58) Field of Classification Search
CPC ........ H01H 50/16; H01H 50/02; H01H 50/32; H03K 17/9502; H03K 17/945; H03K 227/958; H03K 17/941
See application file for complete search history.

(56) References Cited

U.S. PATENT DOCUMENTS

| | | | | |
|---|---|---|---|---|
| 5,861,786 A | * | 1/1999 | Laveau | H01H 27/007 335/132 |
| 6,318,138 B1 | * | 11/2001 | Mathews | E05B 47/0012 292/144 |
| 7,456,368 B2 | | 11/2008 | Fukumoto et al. | |

(Continued)

*Primary Examiner* — Zeev V Kitov
(74) *Attorney, Agent, or Firm* — PatShegen IP; Eva Taksel

(57) ABSTRACT

An electronic operated safety switch has a switching device which houses a switch. The switch is operatively connected to a control or service circuit. The electronic operated safety switch also has an operating device configured for engaging the switch. The switching device comprises a head housing a sensor, and a case housing a lock. The operating device is adapted to send a signal to the sensor, thereby controlling the switch. The switch comprises an actuator housed in the case, the actuator configured to operate on the lock upon the receiving by the sensor of the signal.

12 Claims, 7 Drawing Sheets

(56) References Cited

U.S. PATENT DOCUMENTS

| | | |
|---|---|---|
| 7,563,995 B2 | 7/2009 | Jones |
| 7,775,072 B2 | 8/2010 | Pullmann et al. |
| 9,316,022 B2 * | 4/2016 | Tyner ..................... E05B 17/00 |
| 2004/0159134 A1 * | 8/2004 | Eichenauer ......... E05B 47/0046 70/278.1 |
| 2011/0259060 A1 | 10/2011 | Leska et al. |

* cited by examiner

ELECTRONIC-OPERATED SAFETY SWITCH

CROSS-REFERENCE TO RELATED PATENT APPLICATIONS

This application is the US National Phase application of PCT Application PCT/IB2014/066708, filed Dec. 8, 2014, titled "ELECTRONIC-OPERATED SAFETY SWITCH," which is incorporated herein by reference in its entirety.

BACKGROUND

1. Field

The present invention finds application in the field of electrical safety devices and in particular relates to an electronically operated safety switch.

2. Brief Description

Safety switches designed to be applied to barriers and panels for protection of machines and industrial plants comprise a casing designed to be anchored to a fixed part of the protection and housing thereinside the electrical and electronic switching components for connecting the switch to the plants to be controlled.

Instead, an operating element designed to interact with the switch to open/close one or more circuits connected to the switch itself at the opening and closing of the panel or other moving part is fixed in correspondence of the door or opening panel of the protection.

In this way, the activation of the controlled plant is made possible only if the protection is in safe state with the panel closed, when there is interaction between the switching portion and the operating element.

In this context, the switches of greater diffusion provide an interaction between the mobile actuator and the circuit portion contained in the fixed casing through a slot in the casing.

Through this slot it will be possible to insert a suitably shaped actuator, e.g. a key, to act on an locking/unlocking mechanism for suitable contacts housed in the casing, as disclosed for example in U.S. Pat. No. 7,456,368 and in DE10056458.

Some of these switches are provided, close to the actuator, of a centering element which serves mainly to recover the possible misalignment between the slot of the casing and the actuator. Similar switches are disclosed in U.S. Pat. No. 7,563,995 and EP2112674.

These switches, even if relatively reliable, have some operative drawbacks, especially because of the possibility that dust or dirt creep into the slot, in addition to presenting safety problems.

As matter of fact, the particular configuration of the slot makes it possible to insert thereinto, due to a negligent or fraudulent conduct, a different actuator similar to the one in charge associated with the movable part of the protection, being able to cause a not safe restart of the system even in a condition of open protection.

For these reasons, most recent solutions involve the replacement of the mechanical actuators with electronic and encoded actuators which provide the use of transponder devices, for example of the Radio Frequency Identification type (RFID) that make possible the communication between the fixed part and the movable part of the switch, allowing the mutual recognition and activation of the system only in a safe condition.

For example, U.S. Pat. No. 7,775,072 discloses a switch provided with a movable portion anchored to the door of a security barrier and provided with an actuator with one end designed to be inserted in a recess made in the fixed portion of the switch.

The end of the actuator is also provided with a transponder adapted to communicate with a detection circuit placed in the recess when the distance between the elements reaches a minimum value, for signaling the correct closure of the door. The movable portion houses thereinside a locking element which interacts with the actuator and keeps it in the closed position, being able to be removed only after the operation of a piston actuated by a command sent via the detection circuit.

US2011/0259060 discloses a switch similar to that described above and in which there is an actuator of the key type provided at one end with a transponder adapted to be detected by a sensor housed in the fixed part of the switch, in which a block element is also housed.

WO2013/087 183 discloses a safety switch having a box-shaped casing provided both with a slot adapted to receive an key actuator provided with mechanical coding, in particular a solenoid, and a proximity sensor adapted to communicate with the actuator to detect its position.

These latter types of switches, while ensuring greater reliability and safety, are however affected by some drawbacks.

For example, in this last case the switch is still of essentially mechanical type, with a key actuator that acts on a kinematic mechanism connected to traditional switching means. The proximity sensor has the sole purpose of detecting the presence of the actuator for generating a presence signal, to enable the switching means.

However, the lock of the actuator in the closed position is always entrusted to the mechanical elements, inherently unsafe.

Moreover, the connection between the proximity sensor and the switching means is realized by wires located externally to the case defining both an encumbrance and a potential risk due to a possible contact with the actuator.

A further drawback of these switches is represented by the fact that the known actuators of the transponder type or other electronic detection system do not guarantee a sufficiently precise alignment between the antenna or transmitter and the reader or receiver, so that there may be an absence of communication even in the closed condition of the protection, with consequent lack of operation of the system.

Furthermore, the known switches have a low flexible configuration that does not allow the application to the protection according to a plurality of orientations, so as to be able to adapt to the various possible methods of opening of the protection.

SUMMARY

The object of the present invention is to overcome the above drawbacks, by providing an electronic operated safety switch with high efficiency and flexibility in mounting.

A particular object is to provide an electronic operated safety switch which is provided with an electronic operating device having two mutually movable elements adapted to interact with each other to detect the correct closed position and wherein it is always guaranteed a sufficiently precise alignment between the above elements.

Still another object is to provide an electronic operated safety switch which can be applied to various types of doors different with each other for the way and direction of the opening through a simple reconfiguration that does not necessarily require disassembly of the switch.

A further object is to provide an electronic operated safety switch wherein the reconfiguration operations may also be performed with the switch already mounted on the barrier or protection, without risk of damaging the electrical cables that connect the electronic operating device to the contacts.

These objects, as well as others which will become more clearly hereinafter, are achieved by an electronic operated safety switch which, according to claim 1, comprises a switching device adapted to be anchored to a fixed part of the protection and having a case defining a longitudinal axis and housing thereinside switching means adapted to be operatively connected to one or more control and/or service circuits of the system for the control thereof and an operating device adapted to be anchored to a movable part of the protection for interacting with said switching means upon the closure of the movable part on the fixed part.

The switching device comprises a head anchored to said case and housing thereinside a locking mechanism of said operating device in the closed position of the movable part, said head further having a first portion provided with a centering hole accessible from said locking mechanism and a second portion having sensor means operatively coupled to said switching means to vary its state as a function of an input signal.

The operating device is adapted to send a proximity signal designed to be received as input from said sensor means for controlling said switching means, a centering member being also provided which is adapted to be introduced in said centering hole for positioning said operating device in correspondence of said head.

The switching means are of the electromechanical or electronic type and comprise an electronic actuator housed in said case and operatively coupled to said locking mechanism to act thereon exclusively upon receipt of said input signal by said sensor means.

Furthermore, at least one between said first and said second portion of said head is rotatably mounted on said case to rotate about a same central axis of said head and to vary the orientation, respectively, of said centering hole and/or said sensor means with respect to said case.

In this way, the switch configuration may be modified in a simple and quick manner to adapt to the specific configuration of the barrier or protection to which the switch is designed and in particular to make a same switch adapted to be applied in an universal manner to both hinged barriers and sliding barriers, either with right or left closing movement.

Furthermore, the presence of electronic type switching means and of an operating device also electronic which operates on the unlocking mechanism will prevent that the locking and unlocking of the operating device from the closing position are entrusted to inherently unsafe mechanical members.

Suitably, said sensor means may be connected to said switching means by electronic connection means housed in said case, so as to avoid the presence of external cables which may break following the rotation of the head or due to an accidental contact with movable parts, for example with the same operating device.

Advantageously, the centering hole may be a hole passing through transversely along said head to be accessible by said centering element from both the open transverse end sections.

In this way, in addition to making the switch more easily orientable, it will prevent that dirt may accumulate inside the hole, since the insertion of the centering member will also have the task of removing any possible foreign bodies.

Moreover, the switching means may be of the electromechanical or electronic type and comprise a logic control unit connected to said sensor means and associated with a terminal block for connection to one or more control and/or service circuits of the system to be switched.

The operating device may include a transponder adapted to send said proximity signal associated with an identification code, while the sensor means may comprise a receiver adapted to be brought in correspondence of said transponder, for example aligned or disposed in a position facing the same, possibly partially staggered in the longitudinal and/or transverse direction, for receiving said proximity signal when said transponder is arranged at a predetermined minimum distance from said head and send said identification code to said logic control unit.

In this way the head will be devoid of the typical slots normally provided to allow access to the control mechanism of the switching means by the operating element, making not possible the activation of the switching means by operating elements different from that applied to the movable part, which will have an identification code to be univocally recognized by the logic unit.

The absence of access slots to the switching means also improve the cleaning of the switch making it more efficient and usable even in environments with high presence of dust.

Advantageously, the case may comprise first axial fastening means of said head adapted to avoid or limit the longitudinal translation thereof with respect to said case, while still leaving free the rotation about said central axis.

This configuration would be particularly advantageous in the presence of the switching means of the electromechanical or electronic type wherein the sensor means are connected to the logic unit by means of cables as the switch may be always supplied in the assembled condition, but leaving the possibility to the end user to choose the best orientation for the head as the latter will be free to rotate as long as it is locked through suitable fastening means, without that it can be completely removed from the case.

Suitably, the case may be substantially prismatic with an upper face provided with a cylindrical opening for the insertion of a first axial tubular projection of said head, said cylindrical opening and said first tubular projection being provided respectively with a first and a second abutment element adapted to interact with one another upon rotation of said head for limiting it to a value less than 360°.

This configuration will avoid that the head can carry one or more complete turns around the central axis which may cause the winding of the cables for connecting the sensor means to the switching means, with the risk of damaging the same.

The switching element may also comprise an auxiliary control device adapted to be interposed between said head and said case and provided with at least one hand-operable emergency button to operate on said switching means.

In turn, the auxiliary device may comprise a prismatic tubular body having at said case from a second axial tubular projection having a third abutment element adapted to interact with said first abutment element and on the side of said head a fourth element abutment element adapted to interact with said second abutment element upon rotation of said prismatic body relative to said case and said head for limiting the relative rotations to a value less than 360°.

This configuration, in addition to increasing the functionality of the switch, giving a higher degree of safety, at the same time will increase the flexibility of use as the control element may be oriented independently from the head, and then regardless of the closing mode of the protection.

Furthermore, said emergency button may comprise an actuating element connected to a side face of said prismatic body by a transverse rod having adjustable length, so that it may be applied to panels or barriers of any thickness.

Advantageous forms of the invention are obtained according to the dependent claims

BRIEF DESCRIPTION OF THE DRAWINGS

Further features and advantages of the invention will become more apparent in light of the detailed description of some preferred but not exclusive embodiments of an with electronic operated safety switch, shown by way of non-limiting example with the aid of the accompanying drawings, wherein.

DETAILED DESCRIPTION

With reference to the attached figures some preferred but not exclusive embodiments of an electronic operated safety switch according to the invention are shown which are designed to be applied, in a preferred but not exclusive manner, to protection of the barrier or movable panel type adapted to prevent unsafe access to an operating machine or industrial plant.

In a known manner, the switch will be designed to be applied to the protection in correspondence of an access thereof to stop in a substantially immediate manner the operation of the machine or plant in case of opening of a closing door or panel of such access.

In particular, an electronic operated safety switch, globally referred with 1, comprise a switching device 2 adapted to be anchored to the fixed part of the protection, close to the access to be monitored, and an operating device 3 adapted to be anchored to the movable part of the protection designed to close the access to be brought close to the switching device 2 upon to closing movement of the movable part.

In a known manner, the closure of the protection will cause the activation of the machine or plant while the plant will be locked automatically at the opening of the access, according to operating procedures described hereinafter.

Figure 1:
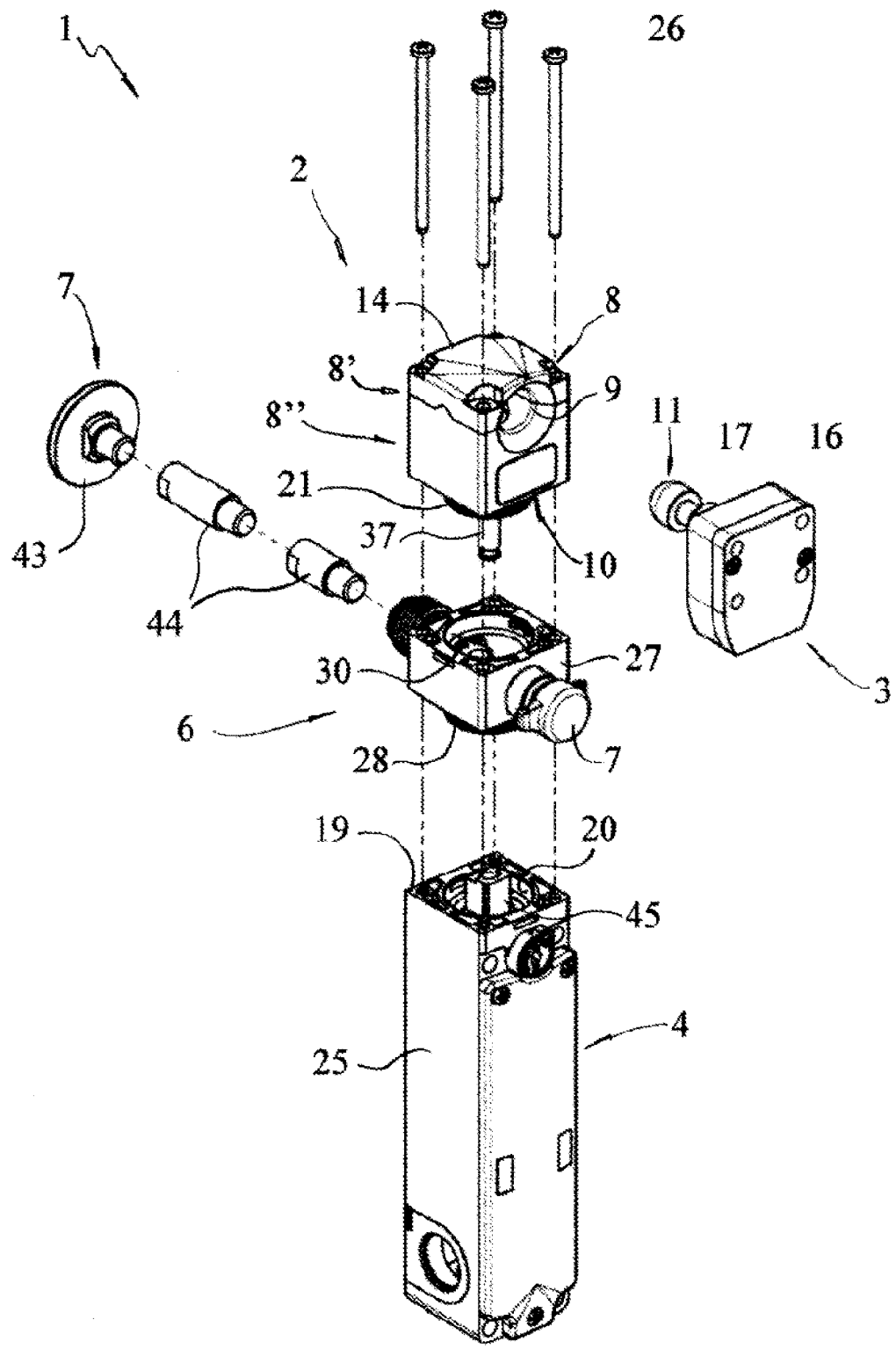
FIG. 1 is a partially exploded elevated view of a switch of the invention in a first preferred embodiment.
Figure 2:
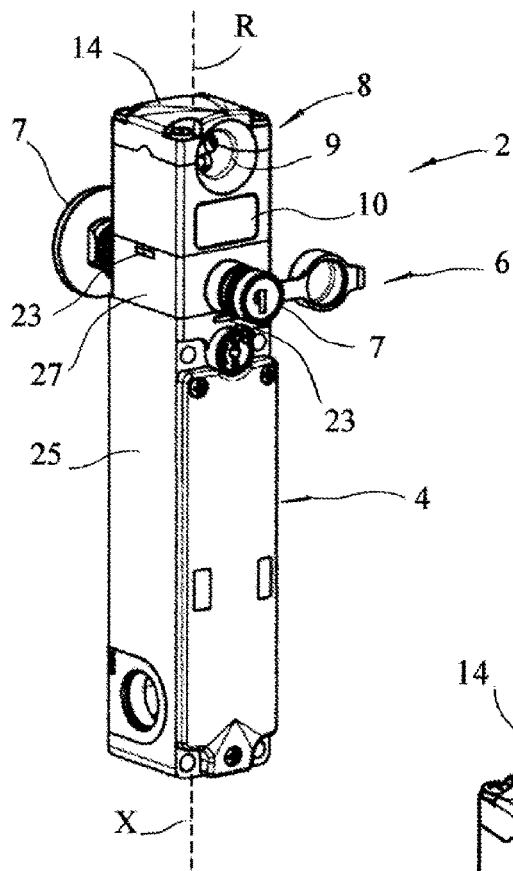
FIG. 2 is an elevated view of a switching device of the switch of FIG. 1.

In the configuration of FIG. 1 the switching device 2 is composed essentially of three modules mutually assembled together in a removable manner, as shown for example in FIG. 2.

In particular there are a lower case 4 which extends along a longitudinal axis X and houses thereinside switching means 5 adapted to be operatively connected to one or more control and/or service circuits of the plant for the control thereof, an intermediate auxiliary control device 6 adapted to be anchored directly to the case 4 and provided with one or more hand-operable emergency buttons 7 for operating on the switching means 5 and an upper head 8.

Figure 3:
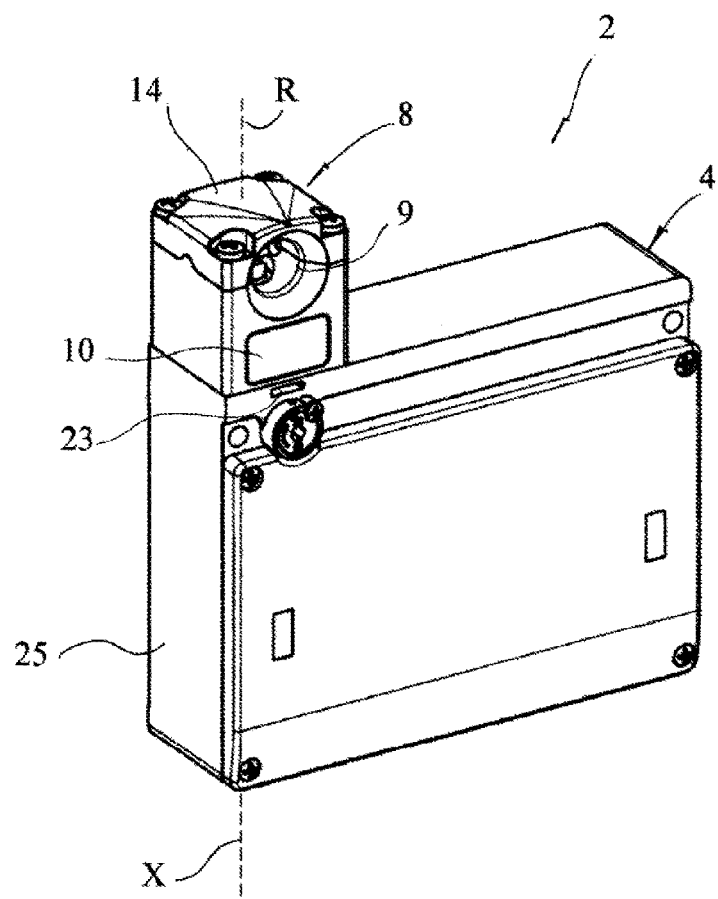
FIG. 3 is an elevated view of a switching device of a switch of the invention according to a second preferred embodiment.

As can be seen from FIG. 3, the case 4 may also have a non-symmetrical shape with respect to the longitudinal axis X with the longitudinal dimension which may even not be the predominant one, and with the head 8, which will be arranged in an asymmetric position.

Further embodiments of the case 4 will also be possible depending on the space and/or aesthetic requirements and/or function of the electronic component to be housed thereinside.

Figure 7:
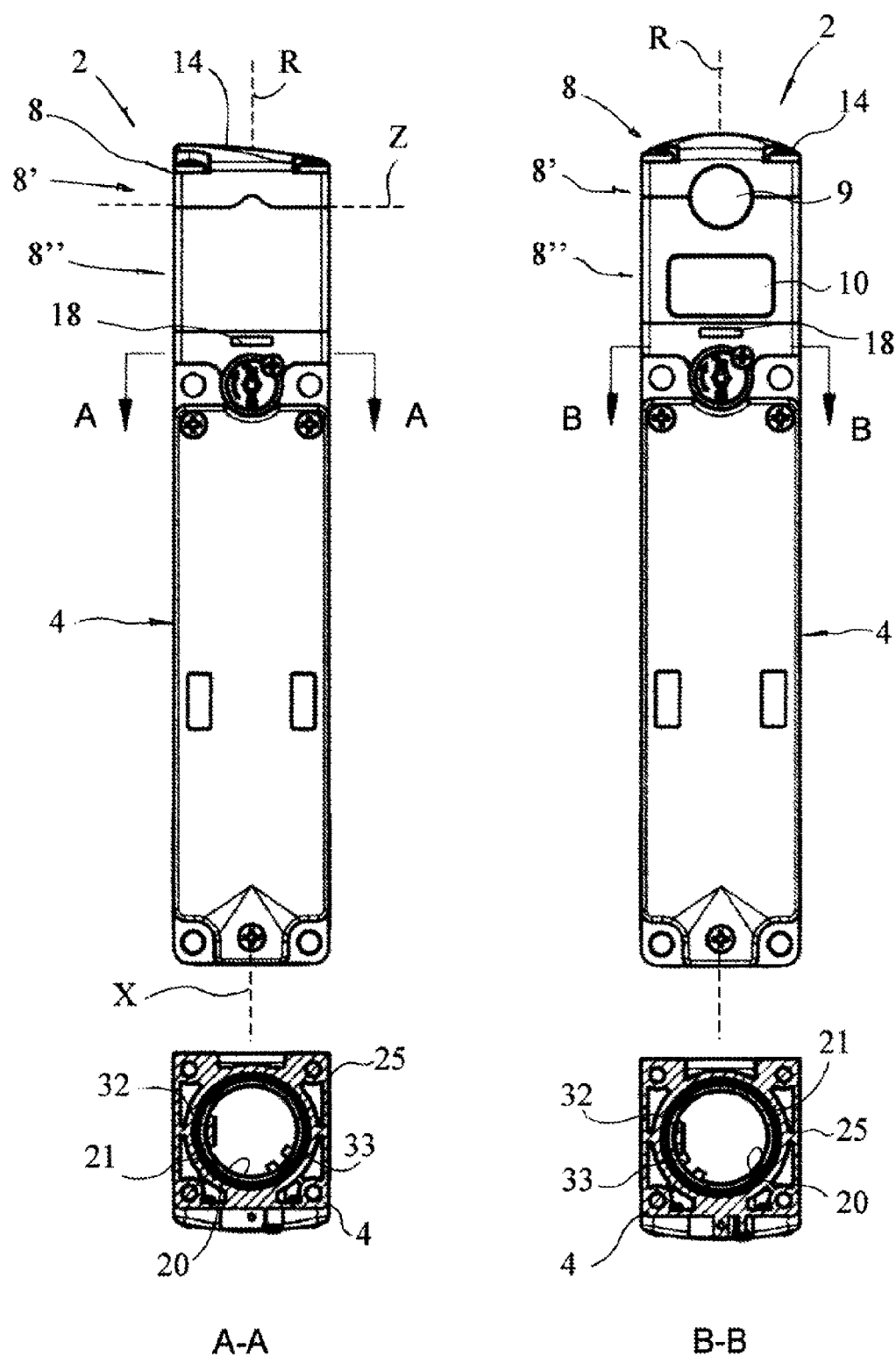
FIG. 7 is a front view of a switching device according to a third embodiment with two different orientations of the head and wherein a respective cross section is associated to each embodiment.

The head 8 may be applied above the auxiliary control device 6, as shown in FIG. 2, or directly to the case 4 if the intermediate device 6 is not provided, as for example in the same FIG. 3 or in the configuration of FIG. 7.

The head 8 has a centering hole 9 and sensor means 10 operatively coupled to the switching means 5 to vary the state as a function of an input signal received by the operating device 3.

The latter in turn is provided with a centering member or pin 11 adapted to be inserted into the centering hole 9 of the head 8 at the time of closure of the protection to position the operating device 3 in correspondence of the head 8.

Moreover, the operating device 3 is adapted to send a proximity signal designed to be received as input from the sensor means 10 present on the head 8 for controlling the switching means 5 and cause the closing of the circuits of the system.

Figure 5:
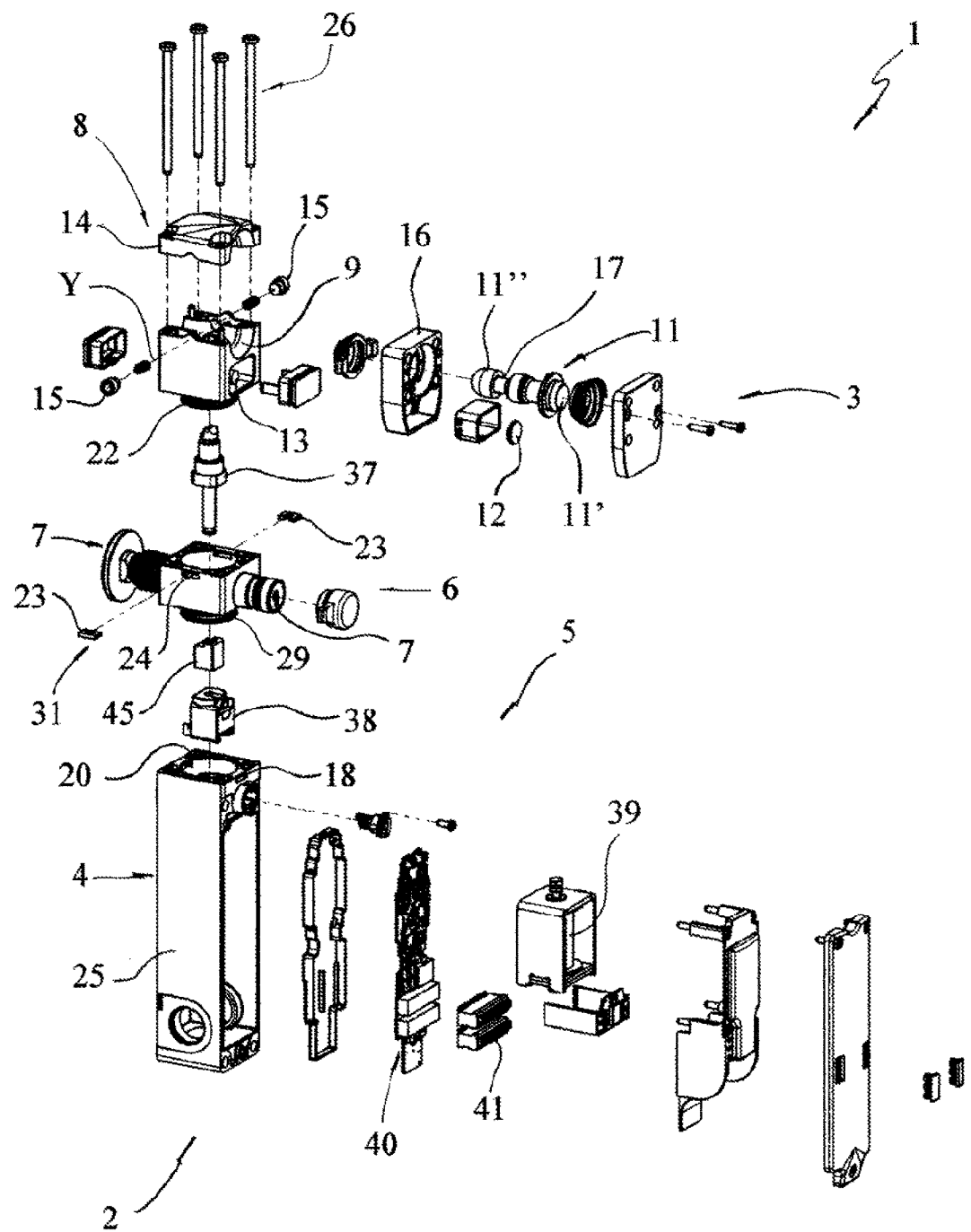
FIG. 5 is a totally exploded elevated view of the switch of FIG. 1.

More precisely, the operating device 3 will have a transmitter 12, shown in FIG. 5, such as a transponder or the like, adapted to send the proximity signal to the sensor means 10, provided in turn with one or more receivers 13 adapted to receive the signal when the distance between the operating device 3 and the head 8 is at least equal to a predetermined minimum value sufficient for considering the protection closed.

The hole 9 and the centering pin 11 will have the task of recovering any play or misalignment between the respective parts produced during assembly or use of the switch 1, by placing the transmitter 12 and receiver 13 in reciprocally facing and longitudinally aligned positions in a more or less precise manner, even slightly offset, and in any case suitable to allow the mutual interaction.

According to a peculiar feature of the invention, the head 8 consists essentially of a first portion 8' provided with the centering hole 9 and a second portion 8" provided with the sensor means 10.

Suitably, at least one of the two portions 8', 8" of the head 8, preferably both, will be rotatably mounted on the case 4 to rotate about a same axis of rotation R preferably longitudinal and substantially central with respect to the head 8, so as to vary the orientation respectively of the centering hole 9 and of the receiver 13 of the sensor means 10.

Figure 4:
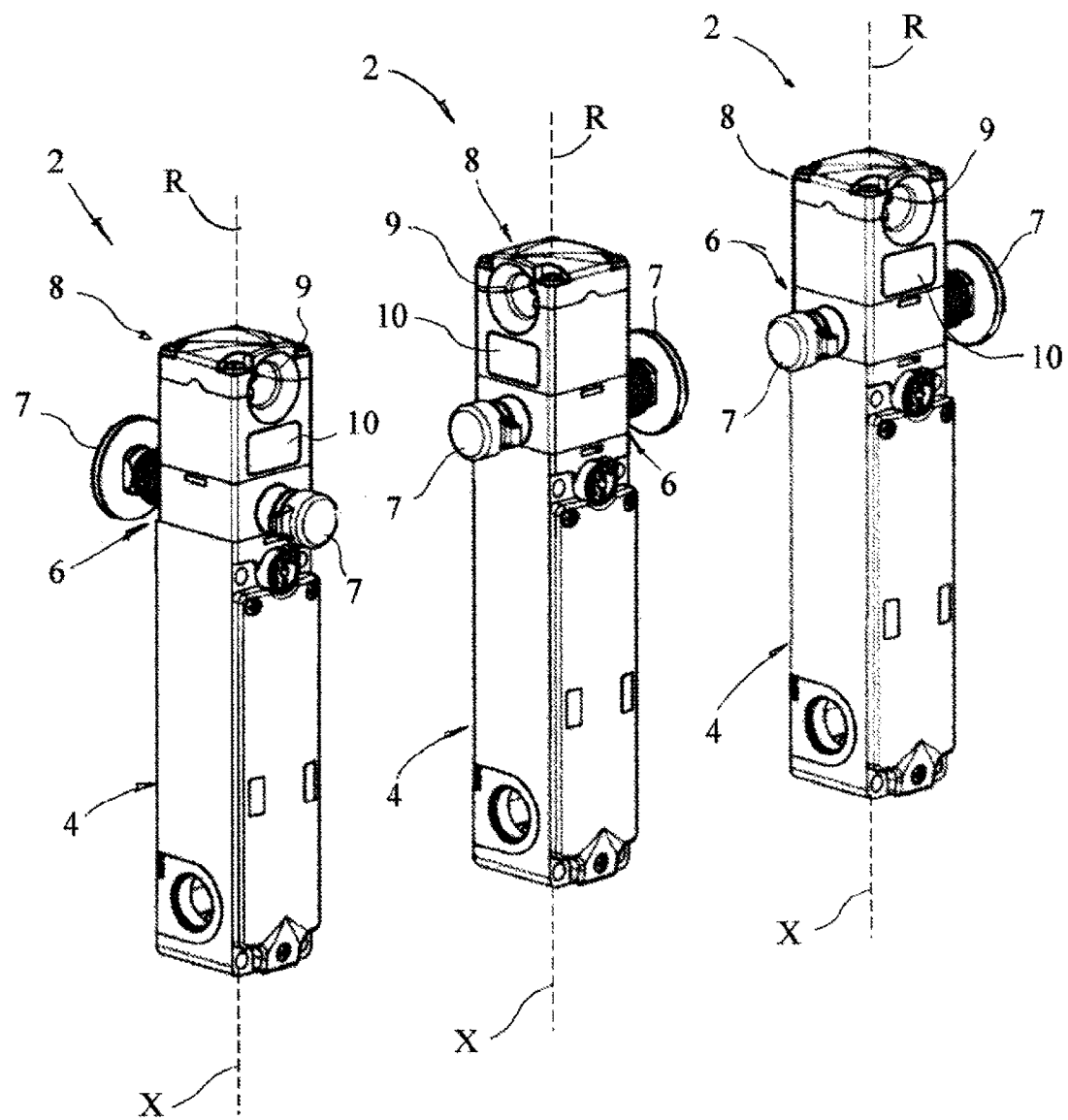
FIG. 4 shoes the switching device of FIG. 2 in three different configuration of assemblage and orientation of the head.

In FIG. 4 there is shown a switching device 2 according three different arrangements of the head 8. In addition, from this figure, it is also noted that the auxiliary control device 6 may be rotated relative to the case 4 and/or to the head 8 to orient the emergency buttons 7 in an independent manner with respect of the centering hole 9 and the sensor means 10.

In the shown configurations, the two portions 8', 8" of the head 8 are at least partially integral with each other, so that the centering hole 9 and the sensor means 10 may rotate in a unitary manner with each other.

As most clearly visible from FIG. 5, the first portion 8' of the head 8 may possibly have a removable top 14 to allow the temporary removal, useful during assembly, for example to allow the positioning inside the hole 9 of elastic retaining elements 15 operating in opposite directions along a direction Y transverse to the extension direction Z of the centering hole 9.

These retaining elements 15 will act laterally on the centering member 11 inserted in the hole 9 to exert a minimum transverse holding force useful to avoid that the centering member 11 can be separated from the head 8 upon vibration or other small forces transmitted to the barrier during normal use of the machine or plant.

However, according to an alternative embodiment, not shown in these figures, the two portions 8', 8" of the head 8 may be mutually rotatable to allow the angular orientation of the centering hole 9 and of the sensor means 10 in a mutually independent manner.

The operating device 3 comprise essentially a base 16 adapted to be anchored to the movable part of the protection in a direct manner or through appropriate mounting brackets, not shown, and which will house thereinside the transmitter 12, which will be suitably arranged below the centering pin 11.

The latter will protrude transversely from the base 16 and will have mainly cylindrical shape with an inner end 11' inserted in the base 16 so as to allow a slight oscillation of the pin 11, which is useful to recover possible mismatches with the centering hole 9, and an outer end 11" rounded or tapered to facilitate its insertion into the centering hole 9 and the action on the switching means 5, as disclosed below.

The pin 11 will also have an intermediate perimetral recess 17 wherein the retaining elements 15 provided in the centering hole 9 will fit.

The centering hole 9 will preferably be a hole passing through transversely to the head 8 to be accessible by the centering member 11 from both the transverse end sections, regardless of the position of the receiver 13.

Furthermore, the centering hole 9 will be substantially cylindrical with one or both the end sections flared to define an invitation for the centering pin 11 and facilitate the mutual coupling even in the presence of relatively marked misalignments.

According to a further particularly advantageous aspect, the case 4 will comprise first axial fastening means 18 of the head 8 adapted to avoid or limit the longitudinal translation relative to the case 4, but at the same time leaving it free to rotate around the central axis R.

In particular, the case 4 will be substantially prismatic with an upper face 19 provided with a cylindrical opening 20 for the insertion of a first axial tubular projection 21 of the head 8, in the case wherein the intermediate device 6 is not provided.

The first projection 21 will comprise an external peripheral groove 22 in which the first axial fastening means 18 will be inserted.

These latter, in the shown embodiments, are constituted by respective pairs of fins 23 adapted to be transversely inserted into corresponding diametrically opposite slots 24 made in the side wall 25 of the case 4 for engaging the peripheral groove 22 from opposite sides.

In this way, once the fins 23 will be inserted in the peripheral groove 22 through the respective slots 24, it will prevented that the head 8 may be removed from the case 4.

At the same time, however, the peripheral groove 22 will always be slidable with respect to the fins 23 to allow the at least partial rotation of the head 8 necessary to obtain the desired orientation.

The stable fixing of the head 8 on the case 4 will be obtained by longitudinal screws 26 to be inserted in suitable seats of the head 8 and of the case 4 once the orientation of the head 8 will be selected.

In the case in which the auxiliary control device 6 is provided, the same may present a prismatic body 27 having a second axial tubular projection 28 similar to the first 21 to fit into the opening 20 of the cylindrical case 4 and engage with the first axial fastening means 18 to axially lock the control device 6, leaving still free to rotate about the central axis R until the fixing with the above screws 26.

In a manner similar to the first tubular projection 21, the second projection 28 will also comprise a respective outer peripheral groove 29 adapted to be engaged by corresponding fins 23 of second axial fastening means 31 substantially similar to the first means 18 and adapted to be inserted into corresponding slots 24 provided in the prismatic body 27 to interact with the groove 22 of the first projections 21 and axially but rotatably fastening the head 8 to the prismatic body 27.

Both the first and the second projections 21, 28 may have a further peripheral groove for housing a respective seal, not shown.

Moreover, the prismatic body 27 will comprise, at the head 8, a respective cylindrical opening 30 adapted to rotatably receive the first tubular projection 21.

From the sections of FIG. 7 it is also possible to observe that the first cylindrical opening 20 and the first tubular projection 21 will also be provided respectively with a first 32 and a second abutment element 33 adapted to interact with each other upon rotation of the head 8 with respect to the case 4, in the absence of the intermediate device 6, to limit it to a value less than 360°.

In particular, the first abutment element 32 radially projects inwardly from the cylindrical side wall of the opening 20 to impact, due to the rotation of the head 8, the second abutment element 33, which extend radially inwardly from the first tubular projection 21.

Figure 8:
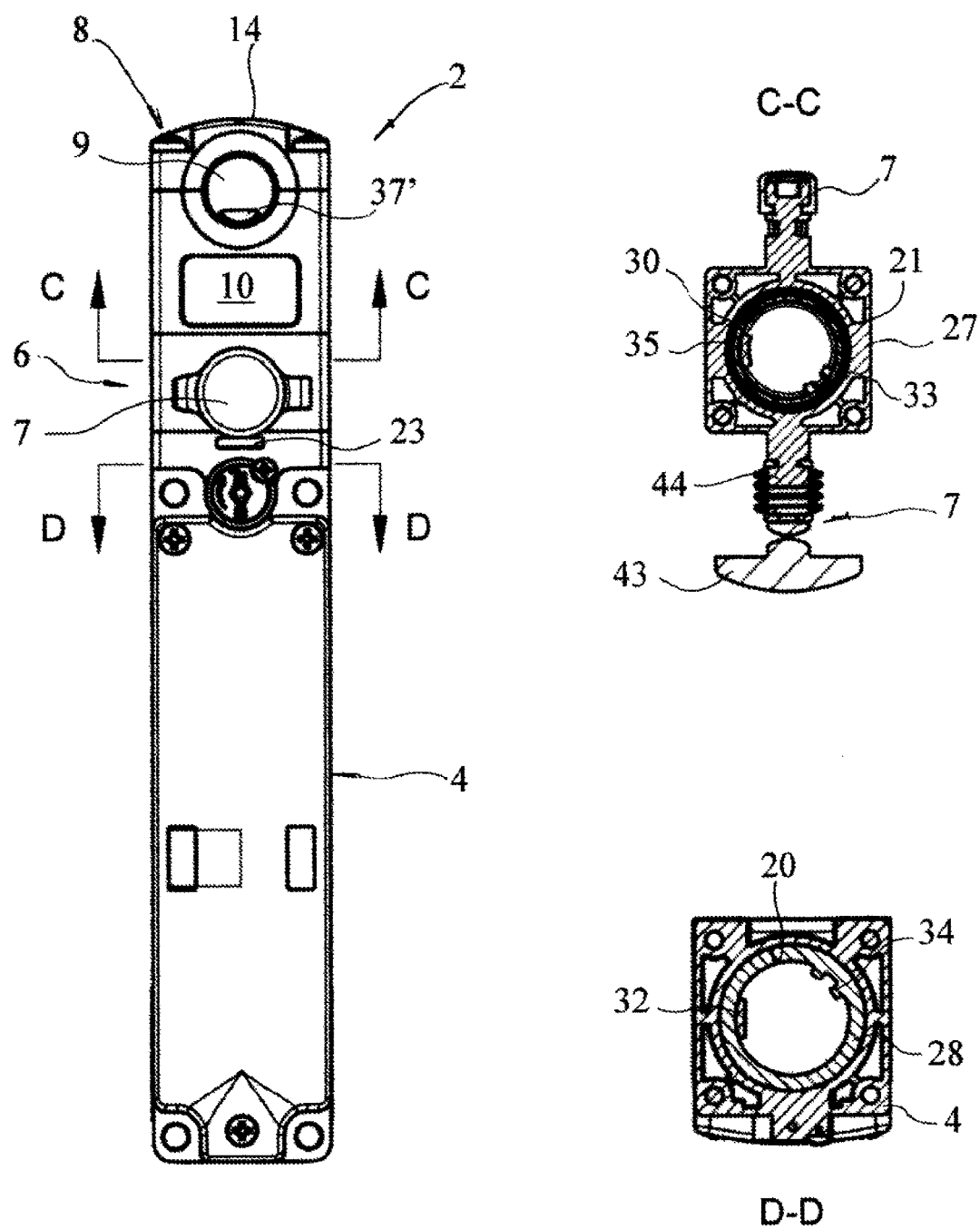
FIG. 8 is a front view of the switching device of FIG. 2 associated with two different cross sections.

As shown instead in FIG. 8, the auxiliary control device 6 will comprises, from the side of the case 4, a third abutment element 34 which extends from the second axial tubular projection 28 for interacting with the first abutment element 32.

From the side of the head 8 it will instead have a fourth abutment element 35 adapted to interact with the second abutment element 33 upon rotation of the prismatic body 27 relative to the case 4 and to the head 8, for limiting the relative rotations to a value less than 360°.

Figure 6:
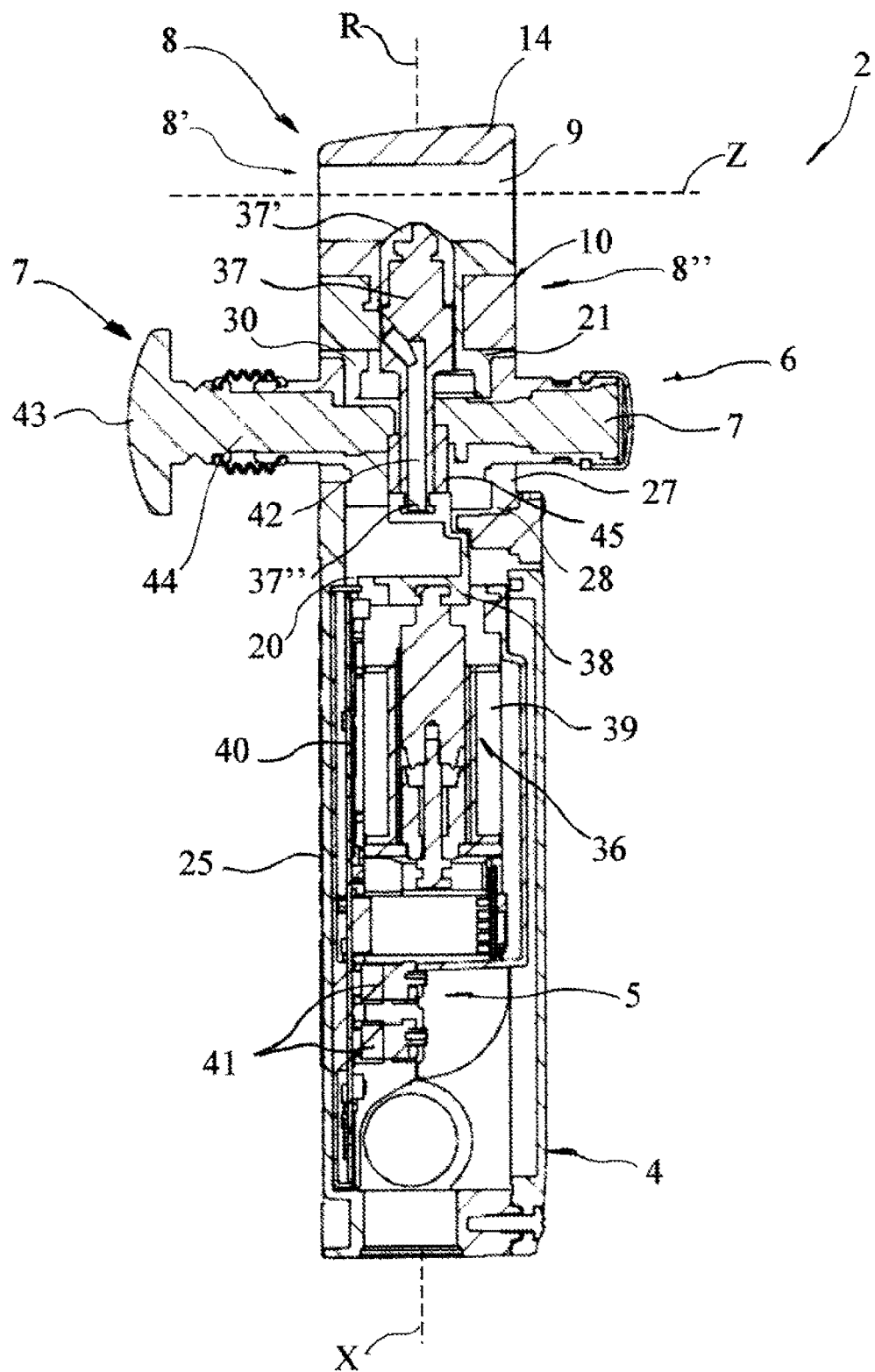
FIG. 6 is a longitudinally sectioned side view of the switching device of FIG. 2.

As regards the switching means 5, they will preferably be of the electromechanical or electronic type and comprise a locking mechanism 36 housed at least partially in the case 4 and having a sliding longitudinal rod 37 with an upper end 37' inserted in the head 8 to project into the centering hole 9, as more clearly visible from FIG. 6, and interact with the centering pin 11 at the time of closure of the protection.

The lower end 37" of the rod 37 will be fastened to a pushing element 45 to act on a slider 38 and operate on an actuator 39, for example an electromagnet, associated to a logic control unit 40, for example an electronic board, which in turn will be associated with a terminal 41 for connection to one or more control and/or service circuits of the system to be switched.

In particular, at the insertion of the pin 11 into the centering hole 9 an interaction between the transponder 12 and the receiver 13, or equivalent provided means, will occur with consequent transmission of the command signal to the logic unit 40 for the activation of switching means 5 in the event of a positive comparison between said identification codes.

The control logic unit 40 will activate the electromagnet 39, causing the ascent of the rod 37 to bring its upper end 37' inside the peripheral recess 17 of the pin 11 so as to lock the operating device 3 to the switching device 2 and realize the safe locking of the protection.

The terminal block 41 may comprises two or more pairs of terminals for connection of respective connection cables to the control and/or service circuits of the machine or plant, so as to switch the same between the states of opening and closing depending on the activation of the locking mechanism 36.

By way of example, the switching means 5 may be connected to the power supply circuit of the machine or plant, in order to command its downtime at the opening of the protection, or, they may be connected to the emergency or signaling circuits, according to known methods.

In particular, the switching means 5 may be configured in a similar way as provided in the safety switch disclosed in the application WO2013098788 in the name of the same Applicant, to which reference is made for greater detail.

However, it is understood that the features of the switching means 5 may also be different and do not represent in itself a limitation on the scope of protection of the present invention.

Even the sensor means 10, in particular the receiver 13 and the transmitter 12 may be configured in an identical or technically equivalent manner to the analogous elements of the switch of the above-cited application WO2013098788, so as to define a coupling of the Tag/RFID type.

In particular, the transmitter 12 may be a transponder adapted to send a proximity signal associated with an identification code.

The sensor means 10 will comprise a receiver 13, for example an antenna, adapted to be aligned to the transponder 12 for receiving the proximity signal together with the identification code when the transponder 12 is placed at a predetermined minimum distance from the head 8, so as to send the identification code to the logic control unit 40.

According to a preferred but not exclusive configuration, the logic control unit 40 may be programmed to define for the closing phase a minimum distance that must be reached by the operating device 3 with respect to the head 8 to provide the consent to the starting the system and a maximum distance of greater value to which the same parts have to be placed in the opening phase to cause the system downtime, to make more safe the closing stage but at the same time to take into account any plays and to avoid that the control unit 40 erroneously receives a signal of open door even in cases in which the same is closed.

The control logic unit 40 will have stored in memory the same identification code in order to allow the switching of the power supply circuit of the system from the opening state to the closing one only in the case of correspondence between the transmitted code and the stored one, thus enabling the safe start of the system.

Suitably, the receiver 13 will be completely contained in the head 8, and may be provided with two opposite reading points, positioned inferiorly to the respective open ends sections of the centering hole 9 so as to have the operating device 3 indifferently in correspondence of any one of the sides of the head 8 provided with respective end sections of the hole 9, thus further simplifying the orientation of the head 8.

The receiver 13 will be connected to the logic control unit 40 via one or more cables, not shown, which run along a substantially longitudinal passage 42 that extends along the head 8 and the case 4, preferably at least partially through the rod 37, so as to enable rotation of the head 8 without compromising the integrity of the cables.

As can be seen clearly from the same FIG. 6, the auxiliary control device 6 will comprise one or more hand-operable emergency buttons 7 selected from the emergency mushrooms, key unlocking devices or other hand-operated unlocking devices suitable to operate directly on the locking mechanism 36 bypassing the electromechanical switching means 5.

In particular one of said emergency buttons 7 will be designed to project toward the inside of the barrier so that it can be operated from the inside and thus cause the system downtime in a situation of danger, for example when an operator remains within the security barrier following its closure with consequent start of the system.

This last emergency button 7 will comprise a movable actuating element 43 connected to a side face of the prismatic body 27 by a transverse rod 44 that according to a particularly advantageous variant, visible in FIG. 1, will have an adjustable length.

In particular, the transverse rod 44 will be formed by two or more sections of predetermined length adapted to be mounted in a selective manner to define the final length required which will be higher or lower depending on the thickness of the panel or wall of the barrier which must be crossed.

From the above it appears evident that the switch according to the invention reaches the intended objects and in particular allow to change its configuration in a simple and rapid manner in order to adapt to the specific configuration of the barrier or protection to which the switch is designed.

The switch according to the invention is susceptible to numerous modifications and variations, all falling within the inventive concept expressed in the accompanying claims. All the details may be replaced with other technically equivalent elements, and the materials may be different according to requirements, without departing from the scope of the present invention.

Even if the switch has been disclosed with particular reference to the accompanying figures, reference numbers used in the description and in the claims are used to improve the intelligence of the invention and do not constitute any limitation of the claimed scope.

What is claimed is:

1. An electronic-operated safety switch, particularly for a protection barrier or a panel in a plant, comprising:
   a switching device configured to be anchored to a fixed part of the protection barrier, the switching device having a case defining a longitudinal axis X, the case housing thereinside a switch configured to be operatively connected to a control or service circuit of the plant, thereby enabling control of the switch;
   an operating device configured to be anchored to a movable part of the protection barrier, the operating device configured for engaging the switch upon the closing of the movable part on the fixed part;
   wherein the switching device comprises a head anchored to the case, the case housing thereinside a lock configured for engaging with the operating device when the movable part is in the closing position, the head having a first portion provided with a centering hole accessible by the lock and a second portion having a sensor operatively coupled with the switch, the sensor configured for modifying the operative condition of the switch as a function of a proximity signal;

wherein the operating device is configured to send the proximity signal to be received by the sensor, thereby controlling the switch, the operating device further comprising a centering member configured to be introduced into the centering hole for positioning the operating device in correspondence with the head;

wherein the switch is of the electronic or electromechanical type and comprises an actuator housed in the case, the actuator operatively coupled with the lock and configured to operate on the lock exclusively upon the receiving by the sensor of the proximity signal, wherein at least one of the first portion and the second portion of the head are rotatably mounted on the case and configured for rotating about a central axis R of the head and modifying the orientation respectively of the centering hole or of the sensor with respect to the case.

2. The electronic-operated safety switch of claim 1, wherein the sensor is connected to the switch by an electronic connection housed in the case.

3. The electronic-operated safety switch of claim 2, wherein the first portion and the second portion of the head are integral with each other and configured for rotating the centering hole and the sensor in unitary manner about the central axis R.

4. The electronic-operated safety switch of claim 1, wherein the centering hole is a through-hole passing transversally along the head and configured to be accessible by the centering member at both its opened transverse end sections.

5. The electronic-operated safety switch of claim 1, wherein the case comprises a first axial fastener configured to avoid or limit the longitudinal sliding of the head with respect to the case, while leaving free the rotation thereof about the central axis R.

6. The electronic-operated safety switch of claim 5, wherein the case is substantially prism-shaped and comprises an upper face provided with a cylindrical opening configured for accepting a first tubular projection of the head, the cylindrical opening and the first tubular projection being respectively provided with a first and a second abutment element configured to mutually interact upon the rotation of the head and configured for limiting the rotation of the head to a value less than 360°.

7. The electronic-operated safety switch of claim 6, wherein the switch comprises a logic control unit connected to the sensor and associated with a terminal, the terminal configured for connection with the control or service circuit of the plant to be switched.

8. The electronic-operated safety switch of claim 7, wherein the operating device comprises a transponder configured to send the proximity signal, the proximity signal being associated with an identification code, the sensor comprising a receiver configured to be operatively coupled to the transponder and configured for receiving the proximity signal when the transponder is at a predetermined minimum distance from the head, thereby enabling the sending of the identification code to the logic control unit.

9. The electronic-operated safety switch of claim 8, wherein the receiver is connected to the logic control unit through one or more cables passing along a substantially longitudinal passage which extends along the head and the case.

10. The electronic-operated safety switch of claim 1, wherein the switching device comprises an auxiliary control device configured to be placed between the head and the case, the auxiliary control device provided with at least one hand-operable emergency button configured for operating on the switching device.

11. The electronic-operated safety switch of claim 10, wherein the auxiliary control device comprises a tubular prism-shaped body having at a case end a second axial tubular projection provided with a third abutment element configured to interact with the first abutment element, and having at a head end a fourth abutment element configured to interact with the second abutment element upon the relative rotation of the prism-shaped body with respect to the case and the head, the third and fourth abutment elements configured for limiting the relative rotations to a value less than 360°.

12. The electronic-operated safety switch of claim 10, wherein the emergency button comprises an actuating element connected to a side face of the prism-shaped body by a transverse rod having adjustable length.

* * * * *